(12) United States Patent
Bruce et al.

(10) Patent No.: US 6,248,600 B1
(45) Date of Patent: Jun. 19, 2001

(54) LED IN SUBSTRATE WITH BACK SIDE MONITORING

(75) Inventors: Michael R. Bruce; Jeffrey D. Birdsley; Rosalinda M. Ring; Rama R. Goruganthu; Brennan V. Davis, all of Austin, TX (US)

(73) Assignee: Advanced Micro Devices, Sunnyvale, CA (US)

( * ) Notice: Subject to any disclaimer, the term of this patent is extended or adjusted under 35 U.S.C. 154(b) by 0 days.

(21) Appl. No.: 09/409,976

(22) Filed: Sep. 30, 1999

(51) Int. Cl.[7] .................................................. H01L 21/00
(52) U.S. Cl. .................................................. 438/7; 356/433
(58) Field of Search ................................. 438/5, 7, 8, 9, 438/14, 16, 22, 46, 459, 977; 356/432, 433, 434; 250/330

(56) References Cited

U.S. PATENT DOCUMENTS 5,396,068 * 3/1995 Bethea .................................. 250/330
5,453,405 * 9/1995 Fan et al. .............................. 438/34

* cited by examiner

Primary Examiner—Charles Bowers
Assistant Examiner—Keith Christianson
(74) Attorney, Agent, or Firm—Crawford PLLC

(57) ABSTRACT

Post-manufacturing analysis of a semiconductor device is enhanced via a method that uses a light emitting diode (LED) formed in a semiconductor die. According to an example embodiment of the present invention, a LED is formed within a semiconductor die having a circuit side opposite a back side. The LED is activated and generates radiation. Substrate is removed from the device, and the amount of radiation that passes through the substrate is detected. The amount of radiation that passes through the die is a function of the absorption characteristics of the die and the substrate thickness. By detecting the radiation and using the absorption characteristics of the die, the amount of substrate remaining in the back side of the die is determined and the substrate removal process is controlled therefrom.

20 Claims, 3 Drawing Sheets

LED IN SUBSTRATE WITH BACK SIDE MONITORING

FIELD OF THE INVENTION

The present invention relates generally to semiconductor devices and their fabrication and, more particularly, to semiconductor devices and their manufacture involving techniques for removing substrate from an integrated circuit for analysis.

BACKGROUND OF THE INVENTION

The semiconductor industry has recently experienced technological advances that have permitted dramatic increases in circuit density and complexity, and equally dramatic decreases in power consumption and package sizes. Present semiconductor technology now permits single-chip microprocessors with many millions of transistors, operating at speeds of hundreds of millions of instructions per second to be packaged in relatively small, air-cooled semiconductor device packages. A by-product of such high-density and high functionality in semiconductor devices has been the demand for increased numbers of external electrical connections to be present on the exterior of the die and on the exterior of the semiconductor packages which receive the die, for connecting the packaged device to external systems, such as a printed circuit board.

As the manufacturing processes for semiconductor devices and integrated circuits increase in difficulty, methods for testing and debugging these devices become increasingly important. Not only is it important to ensure that individual chips are functional, it is also important to ensure that batches of chips perform consistently. In addition, the ability to detect a defective manufacturing process early is helpful for reducing the number of defective devices manufactured.

Traditionally, integrated circuit dies have been tested using methods including accessing circuitry or devices within the die. In order to access portions of circuitry in the integrated circuit die it is sometimes necessary to remove substrate from the die and expose a region for analysis. For example, in flip-chip type dies, transistors and other circuitry are located in a very thin epitaxially-grown silicon layer in a circuit side of the die. The circuit side of the die is arranged face-down on a package substrate. This orientation provides many operational advantages. However, due to the face-down orientation of the circuit side of the die, the transistors and other circuitry near the circuit side are not readily accessible for testing, modification, or other purposes. Therefore, access to the transistors and circuitry near the circuit side is from the back side of the chip.

Analyzing flip-chips and other integrated circuit type dies often requires milling the die substrate and accessing certain circuit elements. Such milling may potentially damage elements in the die if not properly controlled. In particular, it is important to have the ability to determine the progression of the removal process and any process endpoints with sufficient accuracy to avoid milling off the node or region to which access is being sought, which could often jeopardize further device analysis. The difficulty, cost, and destructive aspects of methods for testing integrated circuits are impediments to the growth and improvement of semiconductor technologies.

SUMMARY OF THE INVENTION

The present invention is directed to a method for analyzing a semiconductor die that improves the ability control substrate removal from the die for post-manufacturing testing. The present invention is exemplified in a number of implementations and applications, some of which are summarized below.

According to an example embodiment of the present invention, substrate is removed from a semiconductor die having a circuit side opposite a back side, and having a light-emitting diode (LED) formed within the die. The LED is activated and generates radiation. As the radiation travels from the LED and through the back side of the device, some of the radiation is absorbed. The radiation that is not absorbed passes through the back side and is detected. Using the detected radiation, the substrate removal process is controlled.

The above summary of the present invention is not intended to describe each illustrated embodiment or every implementation of the present invention. The figures and detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
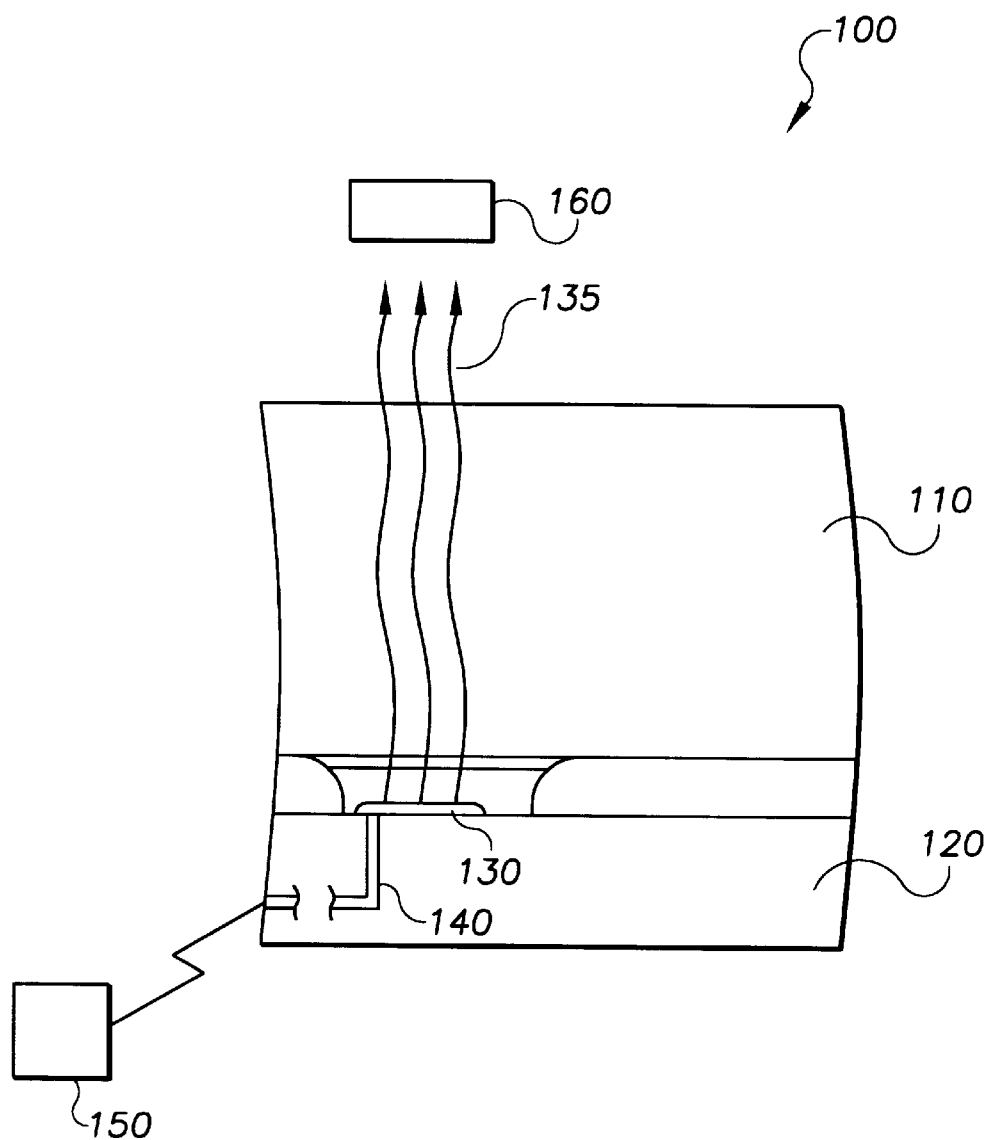
FIGS. 1 is a portion of an integrated circuit die undergoing analysis, according to an example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor devices, and the invention has been found to be particularly suited for flip-chips and other types of integrated circuit dies requiring or benefiting from substrate removal for post-manufacturing analysis. While the present invention is not necessarily limited to such devices, various aspects of the invention may be appreciated through a discussion of various examples using this context.

According to an example embodiment of the present invention, substrate is removed from a back side of an integrated circuit die for post-manufacturing analysis. The die includes circuitry in a circuit side opposite the back side, and a LED formed within the die. The LED is activated and emits radiation, such as infrared (IR) or visible light. As the radiation emitted from the activated LED passes through the back side, some of it is absorbed by substrate in the back side. The amount of radiation that is absorbed is a function of the composition of the material through which it passes. The radiation passed through the die is detected, and the substrate removal is controlled based on the detected amount of radiation and the type of material through which it passed.

One method for using the detected radiation to control the substrate removal includes using a reference die and generating radiation emission data from the reference die. The radiation emission data includes a relationship between the intensity of radiation emitted and the progression of the substrate removal process. The progression of the substrate removal process can be determined by detecting the type of substrate that is being milled, detecting a transition between milling a first type of substrate and milling a second type of substrate, or determining the thickness of substrate remaining between the LED and the back side of the die.

For example, the following equation, based on Beer's Law, is representative of a relationship that can be used to determine the thickness of remaining substrate in the die using the intensity of radiation emitted from the LED and transmitted through the die:

Equation 1:

$$T = \frac{-\log(I_t/I_0)}{a(\lambda) \times c},$$

wherein:
T=the thickness of substrate through which the radiation passes;
$I_t$=the intensity of the radiation after it passes through the substrate;
$I_0$=the intensity of the radiation emitted from the LED;
$a(\lambda)$=the wavelength-dependent absorptivity coefficient of the material through which the radiation passes; and
c=the concentration of the absorbing species (such as the dopant concentration of a portion of an integrated circuit die).

Equation 1 can be used by directly inserting values into the equation, or alternatively in connection with a look-up table having thickness values based on the intensity of the detected radiation and the characteristics of the die and the LED. The absorptivity coefficient $a(\lambda)$, the dopant concentration c, and the initial intensity of radiation emitted from the LED $I_0$ can be pre-determined using the characteristics of the substrate and the LED. By detecting the intensity of the radiation transmitted through the back side $I_t$ and using Equation 1, the substrate thickness between the LED and the back side can be determined.

According to another example embodiment of the present invention, FIG. 1 shows a portion 100 of an integrated circuit die for which the substrate thickness can be determined using Equation 1 and the method described above. The portion 100 has a back side 110 opposite a circuit side 120. A LED 130 is formed in the die and coupled via circuitry 140 to a power supply 150. When the LED 130 is activated via the power supply 150, radiation 135, such as infrared (IR) light, is emitted. The radiation 135 travels through the die and loses intensity via absorption as the back side 110 and other portions of the die that the radiation passes through absorb some of the radiation. The radiation that exits the back side 110 is detected at detector 160 using, for example, IR thermography, and the detected radiation is used to compute the thickness of the substrate in the back side.

Figure 2B:
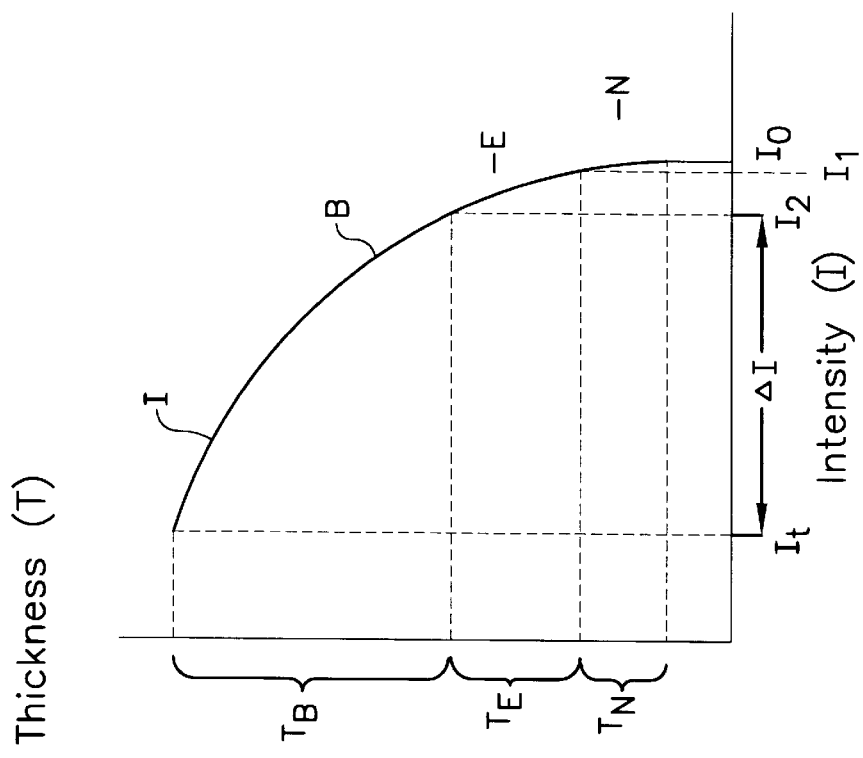
FIG. 2B is a graph showing intensity versus thickness for an integrated circuit die undergoing analysis, according to another example embodiment of the present invention.
Figure 2A:
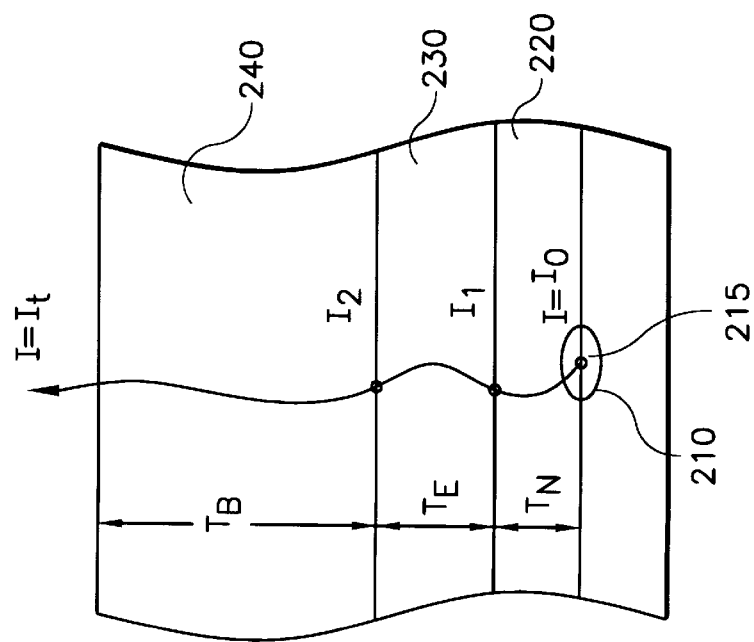
FIG. 2A shows a portion of an integrated circuit die undergoing analysis, according to another example embodiment of the present invention.

When the substrate includes more than one type of material, the thickness determination can be made for each material and the total thickness can be determined therefrom. According to one particular example embodiment of the present invention, FIG. 2A shows a semiconductor die having three types of material formed in layers over an LED 210. The layers include a n-well layer 220, p+ episilicon layer 230 over the n-well layer 220, and a p++ bulk silicon layer 240 over the episilicon layer 230. FIG. 2B is graph of intensity versus thickness for the die shown in FIG. 2A having example adsorption characteristics for each layer. As shown, the bulk silicon absorptivity is greater than the absorptivity of the episilicon as reflected in the different slope of the corresponding portions of the graph. When the LED 210 is activated, some of the radiation emitted from the LED 230 is absorbed as it travels through the die and the transmitted radiation $I_t$ is detected and used to determine the thickness of the remaining substrate.

The intensity of radiation transmitted through each layer is equal to the intensity of radiation entering the layer less the amount lost due to absorption in the layer. For example, as radiation emitted from the diode 215 having an intensity $I_0$ passes through the n-well layer 220 having a thickness $T_N$, a portion of the radiation is absorbed and the intensity of the radiation transmitted by the n-well layer 220 is $I_1$. Similarly, the intensity of radiation transmitted by the episilicon layer 230 having a thickness $T_E$ is $I_2$, and the intensity of radiation transmitted by the bulk silicon layer 240 having a thickness $T_B$ is $I_t$.

When the thickness and absorption characteristics of a layer are known, the loss in intensity of radiation passing through that layer can be approximated using Equation 1. Referring again to FIG. 2A, as the bulk silicon 240 is being removed, the intensity ($I_t$) is monitored. Equation I is used with each layer's thickness and absorption characteristics to determine the loss in intensity in the n-well layer 220 and the episilicon layer 230. By subtracting the loss in intensity in the n-well layer 220 and the episilicon layer 230 from the initial intensity $I_0$, the intensity of the radiation entering the bulk silicon layer is $I_2$. The amount of intensity lost ($\Delta I$) in the bulk silicon layer 240 is then $I_2-I_t$. The ratio of the intensities ($I_t/I_2$) is used with Equation 1 in place of ($I_t/I_0$) and the thickness of the remaining bulk silicon is determined therefrom.

In a similar manner, the thickness of the episilicon and the n-well layers can be determined as each layer is subsequently removed. For dies having additional layers or regions, the thickness determination can be made in a similar manner for the additional layers. In addition, if the doping within each layer varies, the corresponding adsorption of each differently doped region can be incorporated into Equation 1 for determination of the thickness of each region.

According to another example embodiment of the present invention, a reference intensity versus thickness graph such as shown in FIG. 2B is made for a particular type of integrated circuit die having a LED formed in the die. Once the intensity versus thickness for a particular type of die is known, the intensity of radiation passing through the die at selected stages of substrate removal can be determined. As substrate is removed from an integrated circuit die under test having the same structure as the reference die from which the graph was made, the intensity can be detected and compared to the graph to determine the remaining substrate thickness. In one particular example embodiment, a computer is used to compare the detected intensity from the die under test with the reference graph.

In another example embodiment of the present invention, the rate of change in intensity of the radiation emitted is used to control the substrate removal process. The rate of change of intensity can be used to determine the portion of substrate that is being milled. For example, referring again to FIG. 2B, the graph shows a different slope for removing substrate from different layers in the die. Once the rate of change in radiation intensity, or slope, is known for a particular type of material, the type of material that is being removed can be determined by detecting the rate of change in radiation intensity and matching that rate with a known rate for a particular type of material.

Although FIG. 2B shows intensity versus thickness, the radiation intensity versus time can also be plotted for a particular type of semiconductor die and used in connection with testing similar dies. Using time to develop a comparison instead of thickness allows the determination of the type of material that is being removed to be made independently of the substrate removal rate being used. For example, when the substrate removal rate is varied, the change in rate of removal can be compensated for when creating a test graph for comparison to a reference graph formed while removing substrate at a different rate. The removal rate difference can be determined in various manners, such as by comparing the amount of power supplied to a FIB, laser etching device, or other substrate removal device.

Detecting the rate of change of intensity as substrate is removed is also useful for detecting reaching an interface between two layers during substrate removal, according to another example embodiment of the present invention. For instance, when the interface between bulk silicon and epi-silicon is reached, the rate of change of radiation intensity changes, such as shown by way of example in FIG. 2B. By detecting a change in the rate of change, shown as a change in slope in the graph, reaching the interface can be detected. This embodiment is particularly useful because a change in the rate of change in intensity can be detected independently of the actual intensity.

Figure 3:
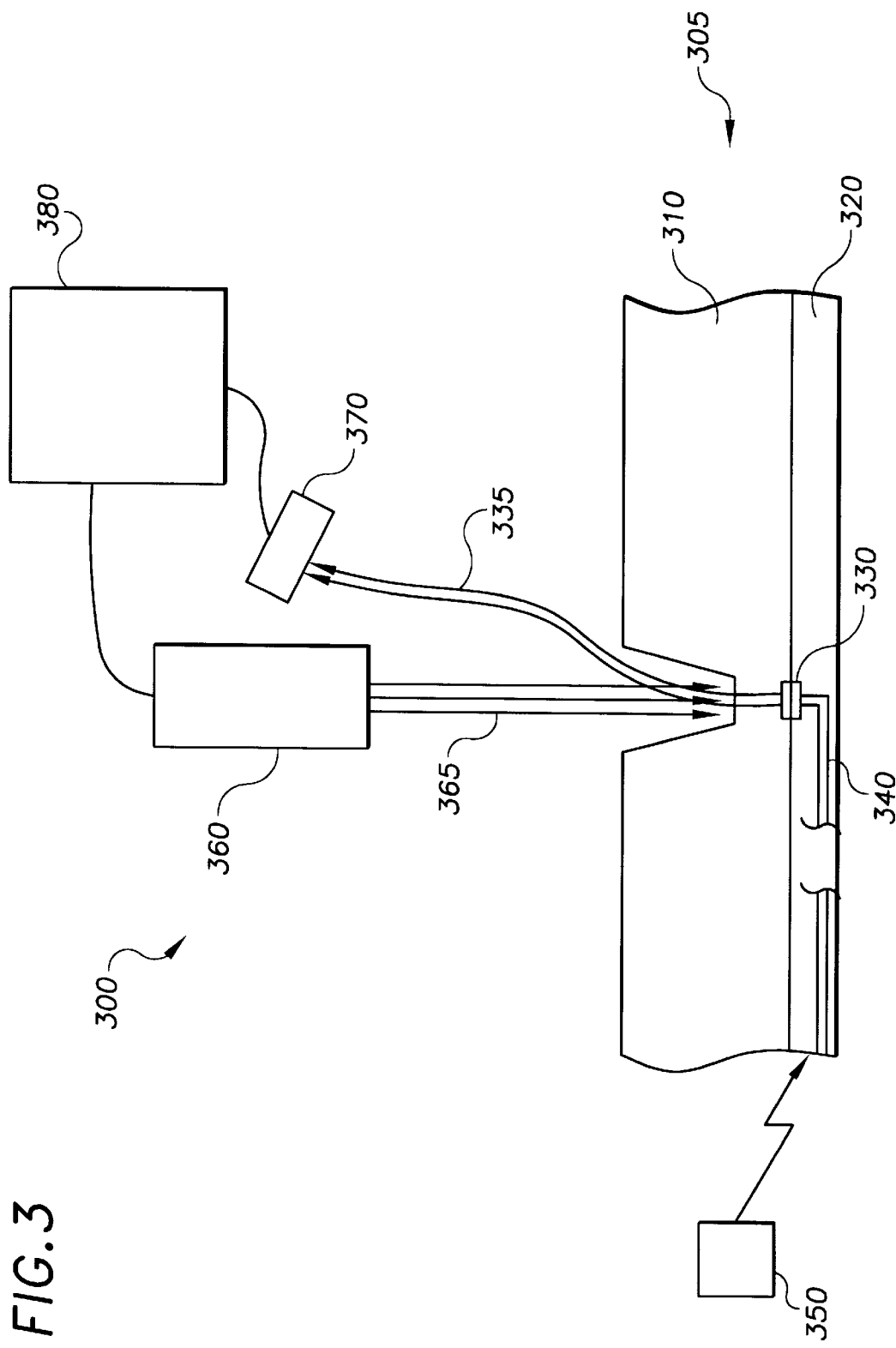
FIG. 3 shows a system for analyzing an integrated circuit die, according to another example embodiment of the present invention.

According to another example embodiment of the present invention, FIG. 3 shows a system 300 arranged to remove substrate for post-manufacturing analysis of an integrated circuit die 305. The die 305 has circuitry in a circuit side 320 opposite a back side 310 and an LED 330 formed in the die. The system includes a power source 350 coupled to the die 305 and adapted to power the LED. A substrate removal device 360 having beam 365 is arranged to remove substrate from the die. The substrate removal device may include devices such as a FIB device, a laser etching device, other ion bombardment devices, or a chemical-mechanical polishing device. The substrate removal device 360 is coupled to a controller 380, such as a computer. Radiation 335 emitted from the LED is detected using a radiation detection device 370 arranged over the die and adapted to detect radiation, such as IR light, from the LED. Various devices can be adapted to detect the LED radiation, such as a laser-scanning microscope, an IR microscope, or an IR camera. The controller 380 is coupled to the detection device 370 and adapted to use the detected radiation to control the substrate removal process. In one particular embodiment, the substrate removal device 360, the controller 380, and the detection device 370 are arranged in an electrical circuit.

In another example embodiment of the present invention, the system in FIG. 3 further includes a test fixture adapted to hold the die. The test fixture may also include the power supply and a conductor for coupling the power supply to the die to power the LED. In one particular embodiment, the test fixture, the power supply 350, the substrate removal device 360, the controller 380, and the detection device 370 are arranged in a single testing arrangement.

While the present invention has been described with reference to several particular example embodiments, those skilled in the art will recognize that many changes may be made thereto without departing from the spirit and scope of the present invention, which is set forth in the following claims.

What is claimed is:

1. A method for removing substrate from an integrated circuit die having circuitry in a circuit side opposite a back side having substrate, and having a LED formed in the die, the method comprising:

activating the LED;

removing a portion of substrate from the back side of the die;

detecting the intensity of radiation emitted from the LED and transmitted through the back side; and controlling the substrate removal as a function of the detected radiation.

2. A method for removing substrate from an integrated circuit die, according to claim 1, further comprising:

providing the absorption characteristics of the die substrate;

using the radiation characteristics of the LED, the absorption characteristics, and the detected radiation to determine the thickness of substrate through which the radiation has passed; and using the determined thickness to control the substrate removal.

3. A method for removing substrate from an integrated circuit die, according to claim 2, wherein using the LED radiation characteristics, the absorption characteristics, and the detected radiation to determine the thickness of substrate through which the radiation has passed comprises:

relating the intensity of the detected radiation to the LED radiation characteristics, the composition of the substrate, and the thickness of the substrate through which the radiation passes; and based on the relationship between the intensity of the detected radiation, the LED radiation characteristics, the composition of the substrate, and the thickness of the substrate through which the radiation passes, computing the remaining substrate thickness.

4. A method for removing substrate from an integrated circuit die, according to claim 2, wherein providing the absorption characteristics of the die substrate includes determining the dopant concentration of the substrate.

5. A method for removing substrate from an integrated circuit die, according to claim 1, further comprising:

using a reference die and determining the intensity of radiation passing through the reference die at selected stages of substrate removal;

comparing the detected intensity to the intensity of radiation passing through the reference die at selected stages of substrate removal from the reference die; and using the comparison to control the substrate removal.

6. A method for removing substrate from an integrated circuit die, according to claim 5, wherein using the comparison to control the substrate removal includes using a computer.

7. A method for removing substrate from an integrated circuit die, according to claim 1, wherein detecting radiation emitted from the LED and transmitted through the back side includes using infrared (IR) thermography.

8. A method for removing substrate from an integrated circuit die, according to claim 1, wherein detecting radiation emitted from the LED and transmitted through the back side includes detecting the rate of change in radiation emitted, and wherein controlling the substrate removal as a function of the detected radiation includes comparing the rate of change in radiation with a known rate of change in radiation for a particular type of material in the substrate, and determining therefrom the type of substrate that is being removed.

9. A method for removing substrate from an integrated circuit die, according to claim 8, wherein determining therefrom the type of substrate that is being removed includes determining the dopant concentration of the substrate being removed.

10. A method for removing substrate from an integrated circuit die, according to claim 1, wherein the die has at least a first layer having a first type of substrate and a second layer having a second type of substrate and formed adjoining the first layer, wherein detecting radiation emitted from the LED and transmitted through the back side includes detecting a change in the rate of change in radiation transmitted, and wherein controlling the substrate removal as a function of the detected radiation includes controlling the substrate removal responsive to detecting a transition from removing all of the first layer to removing the second layer.

11. A method for removing substrate from an integrated circuit die, according to claim 10, wherein detecting a change in the rate of change in radiation emitted includes detecting a change in the dopant concentration of the substrate being removed.

12. A method for removing substrate from an integrated circuit die, according to claim 1, further comprising forming a reference graph of the radiation intensity versus time during substrate removal from a reference die, wherein controlling the substrate removal as a function of the detected radiation includes comparing the detected radiation to the reference graph.

13. A method for removing substrate from an integrated circuit die, according to claim 12, wherein the die is undergoing substrate removal at a different rate than the rate of removal for the reference die, and wherein comparing the detected radiation to the reference graph includes compensating for the difference in substrate removal rate between the die and the reference die.

14. A system for removing substrate from an integrated circuit die having circuitry in a circuit side opposite a back side and a LED formed in the die, the system comprising:
  means for activating the LED;
  means for removing substrate from the back side of the die;
  means for detecting radiation emitted from the LED; and
  means for controlling the substrate removal in response to the detected radiation.

15. A system for removing substrate from an integrated circuit die having circuitry in a circuit side opposite a back side and a LED formed in the die, the system comprising:
  a power source coupled to the die and adapted to power the LED;
  a substrate removal device arranged to remove substrate from the back side of the die;
  a radiation detection device arranged over the back side and adapted to detect radiation emitted from the LED and passing through the back side; and
  a computer arrangement adapted to control the substrate removal in response to the detected radiation.

16. A system for removing substrate from an integrated circuit die, according to claim 15, further comprising a test fixture adapted to hold the die, and wherein the power source is coupled to the test fixture.

17. A system for removing substrate from an integrated circuit die, according to claim 16, wherein the power source is coupled to the test fixture.

18. A system for removing substrate from an integrated circuit die, according to claim 15, further comprising a circuit including the substrate removal device, the radiation detection device, and the computer arrangement.

19. A system for removing substrate from an integrated circuit die, according to claim 15, wherein the substrate removal device includes at least one of: a FIB device, a laser etching device, and a chemical-mechanical polishing device.

20. A system for removing substrate from an integrated circuit die, according to claim 15, wherein the radiation detection device includes at least one of: a laser-scanning microscope, an IR microscope, and an IR camera.

* * * * *

UNITED STATES PATENT AND TRADEMARK OFFICE
CERTIFICATE OF CORRECTION

PATENT NO. : 6,248,600 B1
DATED : June 19, 2001
INVENTOR(S) : Bruce et al.

Page 1 of 1

It is certified that error appears in the above-identified patent and that said Letters Patent is hereby corrected as shown below:

<u>Column 1,</u>
Line 67, after "ability" please insert -- to --.

<u>Column 3,</u>
Line 62, after "exits", please insert -- at --.

<u>Column 4,</u>
Line 7, after "is" please insert -- a --.
Line 32, "Equation Iis" should read -- Equation 1 is --.

<u>Column 5,</u>
Line 24, after "for" please delete "detecting".

Signed and Sealed this

First Day of January, 2002

Attest:

Attesting Officer

JAMES E. ROGAN
Director of the United States Patent and Trademark Office